United States Patent
Cho et al.

(10) Patent No.: US 11,678,476 B2
(45) Date of Patent: Jun. 13, 2023

(54) CAPACITOR AND DRAM DEVICE INCLUDING THE SAME

(71) Applicant: SAMSUNG ELECTRONICS CO., LTD., Suwon-si (KR)

(72) Inventors: Cheoljin Cho, Hwaseong-si (KR); Jaesoon Lim, Seoul (KR); Jaehyoung Choi, Hwaseong-si (KR); Jungmin Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/222,006

(22) Filed: Apr. 5, 2021

(65) Prior Publication Data
US 2022/0093603 A1    Mar. 24, 2022

(30) Foreign Application Priority Data
Sep. 21, 2020  (KR) .................. 10-2020-0121326

(51) Int. Cl.
*H10B 12/00* (2023.01)
*H01L 27/108* (2006.01)
*H01L 49/02* (2006.01)

(52) U.S. Cl.
CPC ........ *H01L 27/10805* (2013.01); *H01L 28/55* (2013.01); *H01L 28/65* (2013.01)

(58) Field of Classification Search
CPC ... H01L 27/10805; H01L 28/55; H01L 28/65; H01L 27/10814; H01L 27/10852; H01L 28/90; H01L 28/40
See application file for complete search history.

(56) References Cited

U.S. PATENT DOCUMENTS

| 7,442,604 B2 | 10/2008 | Choi et al. |
| 7,799,631 B2 | 9/2010 | Park |
| 8,574,998 B2 | 11/2013 | Malhotra et al. |
| 8,603,877 B2 | 12/2013 | Rocklein et al. |
| 9,691,839 B2 | 6/2017 | Lindert et al. |
| 2006/0051978 A1* | 3/2006 | Li ............... H01L 21/02332 438/785 |
| 2007/0228442 A1 | 10/2007 | Kakimoto |
| 2008/0203529 A1 | 8/2008 | Kang et al. |
| 2011/0256682 A1 | 10/2011 | Yu et al. |

(Continued)

FOREIGN PATENT DOCUMENTS

| KR | 19970054073 A | 7/1997 |
| KR | 10-0694390 B1 | 3/2007 |

(Continued)

OTHER PUBLICATIONS

Taiwanese Office action dated Nov. 22, 2021.
European Search Report dated Oct. 28, 2021.
Indian Office action dated Apr. 22, 2022.

*Primary Examiner* — David Vu
(74) *Attorney, Agent, or Firm* — Lee IP Law, P.C.

(57) ABSTRACT

A capacitor and a DRAM device, the capacitor including a lower electrode; a dielectric layer structure on the lower electrode, the dielectric layer structure including a first zirconium oxide layer, a hafnium oxide layer, and a second zirconium oxide layer sequentially stacked; and an upper electrode on the dielectric layer structure, wherein the hafnium oxide layer has a tetragonal crystal phase or an orthorhombic crystal phase.

15 Claims, 9 Drawing Sheets

(56) References Cited

U.S. PATENT DOCUMENTS

| | | |
|---|---|---|
| 2012/0181660 A1* | 7/2012 | Fujiwara ........... H01L 21/02178 |
| | | 257/532 |
| 2012/0225268 A1 | 9/2012 | Antonov et al. |
| 2014/0077336 A1 | 3/2014 | Chiang et al. |
| 2019/0115409 A1 | 4/2019 | Huh et al. |
| 2019/0165088 A1 | 4/2019 | Huh et al. |
| 2019/0148390 A1* | 5/2019 | Frank .................. H01L 21/0228 |
| | | 257/295 |
| 2019/0189615 A1 | 6/2019 | Choi et al. |
| 2020/0006352 A1 | 1/2020 | Avci et al. |
| 2020/0058731 A1 | 2/2020 | Mun et al. |
| 2020/0286985 A1 | 9/2020 | Lim et al. |

FOREIGN PATENT DOCUMENTS

| | | |
|---|---|---|
| KR | 10-2009-0122735 A | 12/2009 |
| TW | 201929291 A | 7/2019 |
| WO | WO 2019-235092 A1 | 12/2019 |

* cited by examiner

CAPACITOR AND DRAM DEVICE INCLUDING THE SAME

CROSS-REFERENCE TO RELATED APPLICATION

Korean Patent Application No. 10-2020-0121326, filed on Sep. 21, 2020 in the Korean Intellectual Property Office, and entitled: "Capacitor and a Dram Device Including the Same," is incorporated by reference herein in its entirety.

BACKGROUND

1. Field

Embodiments relate to a capacitor and a dynamic random-access memory (DRAM) device including the same.

2. Description of the Related Art

In a DRAM device, unit memory cell may include one transistor and one capacitor, and the capacitor may have a high capacitance.

SUMMARY

The embodiments may be realized by providing a capacitor including a lower electrode; a dielectric layer structure on the lower electrode, the dielectric layer structure including a first zirconium oxide layer, a hafnium oxide layer, and a second zirconium oxide layer sequentially stacked; and an upper electrode on the dielectric layer structure, wherein the hafnium oxide layer has a tetragonal crystal phase or an orthorhombic crystal phase.

The embodiments may be realized by providing a capacitor including a lower electrode; a dielectric layer structure on the lower electrode, the dielectric layer structure including a first zirconium oxide layer, a hafnium oxide layer, and a second zirconium oxide layer sequentially stacked; and an upper electrode on the dielectric layer structure, wherein the dielectric layer structure has a thickness of about 20 Å to about 60 Å, and the first zirconium oxide layer, the hafnium oxide layer, and the second zirconium oxide layer are each crystalline.

The embodiments may be realized by providing a dynamic random-access memory (DRAM) device including a substrate; a cell transistor on the substrate, the cell transistor including a gate structure, a first impurity region, and a second impurity region; a bit line structure electrically connected to the first impurity region; and a capacitor on the bit line structure, the capacitor being electrically connected to the second impurity region, wherein the capacitor includes a lower electrode; a dielectric layer structure on the lower electrode, the dielectric layer structure including a first zirconium oxide layer, a hafnium oxide layer, and a second zirconium oxide layer sequentially stacked; and an upper electrode on the dielectric layer structure, wherein the dielectric layer structure has a thickness of about 20 Å to about 60 Å, and wherein the hafnium oxide layer has a tetragonal crystal phase or an orthorhombic crystal phase.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
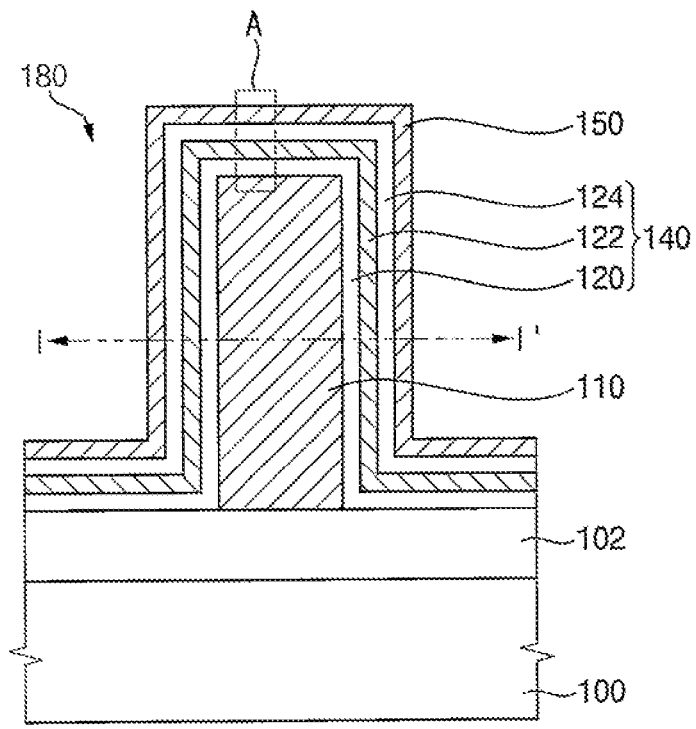
FIGS. 1 to 3 are cross-sectional views of a capacitor in accordance with example embodiments.
Figure 2:
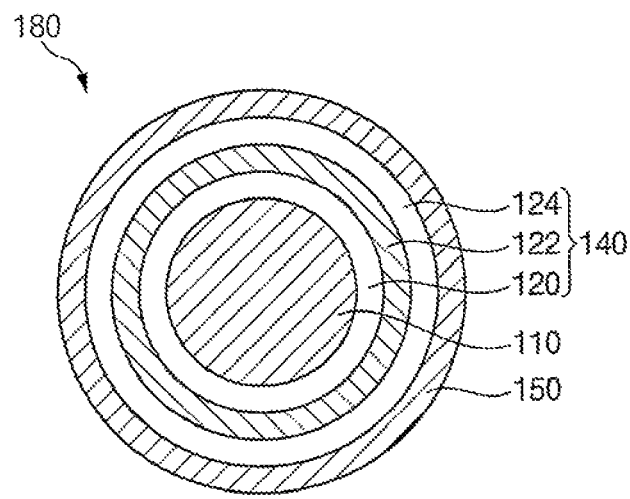
Figure 3:
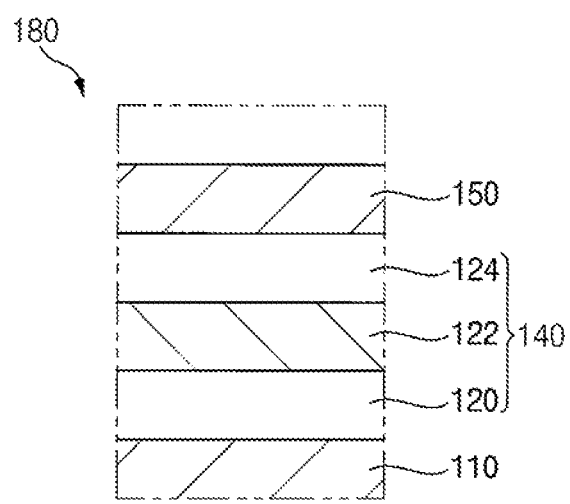
Figure 4:
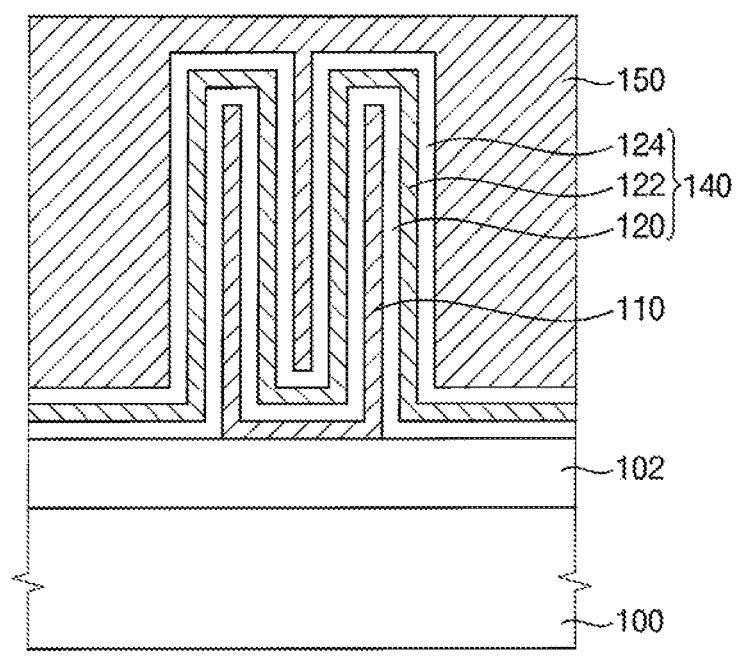
FIG. 4 is a cross-sectional view of a capacitor in accordance with example embodiments.

FIGS. 1 to 3 are cross-sectional views of a capacitor in accordance with example embodiments. FIG. 4 is a cross-sectional view of a capacitor in accordance with example embodiments.

The capacitor shown in FIGS. 1 to 3 includes a lower electrode having a pillar shape. The capacitor shown FIG. 4 includes a lower electrode having a cylindrical (e.g., hollow cylindrical) shape.

FIG. 1 is a vertical cross-sectional view of the capacitor. FIG. 2 is a horizontal cross-sectional view taken along line I-I of FIG. 1. FIG. 3 is an enlarged cross-sectional view of portion A of FIG. 1.

Referring to FIGS. 1 to 4, the capacitor 180 may include a lower electrode 110, a dielectric layer structure 140, and an upper electrode 150 stacked.

In an implementation, the capacitor 180 may be on a lower structure 102 on a substrate 100. In an implementation, the lower structure 102 may include a transistor, a contact plug, a conductive line, an insulating interlayer, or the like.

Each of the lower electrode 110 and the upper electrode 150 may include metal, metal nitride, or conductive oxide. In an implementation, each of the lower electrode 110 and the upper electrode 150 may independently include, e.g., titanium nitride (TiN), titanium (Ti), tantalum (Ta), tantalum nitride (TaN), ruthenium (Ru), tungsten, tungsten nitride, Nb, NbN, indium tin oxide (ITO), Ta-doped $SnO_2$, Nb-doped $SnO_2$, Sb-doped $SnO_2$, V-doped $SnO_2$, or the like. In an implementation, a material of the lower electrode 110 may be the same as a material of the upper electrode 150. In an implementation, materials of the lower electrode 110 and the upper electrode 150 may be different from each other. As used herein, the term "or" is not an exclusive term, e.g., "A or B" would include A, B, or A and B.

The lower electrode 110 may have various three-dimensional structures.

In an implementation, the lower electrode 110 may have a three-dimensional structure such as a cylinder shape or a pillar shape. As shown in FIGS. 1 to 3, the lower electrode 110 may have the pillar shape. As shown in FIG. 4, the lower electrode 110 may have the cylindrical (e.g., hollow cylindrical) shape.

In an implementation, the lower electrode 110 may have a two-dimensional shape such as a plate shape. In this case, the capacitor may have a shape similar to the enlarged view shown in FIG. 3. A capacitance of the capacitor 180 may be determined by a surface area of the lower electrode 110, and the lower electrode 110 may have various modified structures for increasing of the capacitance.

The dielectric layer structure 140 may be between the lower electrode 110 and the upper electrode 150. The dielectric layer structure 140 may contact (e.g., directly contact) a surface of the lower electrode 110 to cover the surface of the lower electrode 110. The dielectric layer structure 140 may be conformally formed on the surface of the lower electrode 110. When the lower electrode 110 has the two-dimensional shape such as the plate shape, the dielectric layer structure 140 may be on an upper surface of the lower electrode 110 to have a two-dimensional shape. When the lower electrode 110 has a pillar shape or a cylinder shape, the dielectric layer structure 140 may be formed along the surface of the lower electrode 110 to have the three-dimensional shape.

For the capacitor 180 having a high capacitance, the dielectric layer structure 140 may be designed to have a high dielectric constant. In an implementation, the dielectric layer structure 140 may have a thickness of an equivalent oxide layer of about 5 Å or less, e.g., about 3.7 Å or less.

The dielectric layer structure 140 may include a plurality of stacked dielectric layers. In an implementation, the dielectric layer structure 140 may have a thickness of about 20 Å to about 60 Å. Maintaining the thickness of the dielectric layer structure 140 at about 20 Å or greater may help prevent an increase in leakage currents in the capacitor. Maintaining the thickness of the dielectric layer structure 140 at about 60 Å or less may help ensure that the capacitor has a high target capacitance. In an implementation, the dielectric layer structure 140 having a thickness of about 20 Å to about 60 Å may be suitable for a capacitor in a highly integrated semiconductor device. Hereinafter, a thickness of a layer means a thickness of the layer in a vertical direction from a surface of a structure under the layer (e.g., a thickness in an outward direction).

The dielectric layer structure 140 may include a main dielectric layer and a sub-dielectric layer. The main dielectric layer may be a ferroelectric material having a ferroelectric property or an anti-ferroelectric property according to an electric field. A dielectric constant of the ferroelectric material may be highly increased within a switching voltage range, which is a voltage range that may be converted from the ferroelectric property to the anti-ferroelectric property or from the anti-ferroelectric property to the ferroelectric property. In this case, when the switching voltage range matches an operating voltage range of the capacitor or is within the operating voltage range of the capacitor, the dielectric constant of the dielectric layer structure may be highly increased. Thus, the capacitor may have a high capacitance in the operating voltage range.

In a highly integrated semiconductor device (e.g., a DRAM device), the semiconductor device may have a low operating voltage range, e.g., an operating voltage range of about −1 V to about 1 V. In an implementation, the highly integrated DRAM device may have the low operating voltage range of about −0.7 V to about 0.7 V. Thus, the dielectric layer structure 140 of the capacitor 180 may be boosted with a high dielectric constant in the operating voltage range of about −1 V to about 1 V.

The dielectric layer structure 140 may include a sandwich or layered structure having a hafnium oxide layer 122 and zirconium oxide layers 120 and 124 directly contacting upper and lower surfaces, respectively, of the hafnium oxide layer 122. In an implementation, the dielectric layer structure 140 may include a first stacked structure in which a first zirconium oxide layer 120/a hafnium oxide layer 122/a second zirconium oxide layer 124 are sequentially stacked. The first zirconium oxide layer 120, the hafnium oxide layer 122, and the second zirconium oxide layer 124 included in the first stacked structure may each be crystallized or crystalline layers.

The main dielectric layer of the dielectric layer structure 140 may be the hafnium oxide layer 122. A (e.g., crystalline) hafnium oxide layer having a tetragonal crystal phase or an orthorhombic crystal phase may be the ferroelectric material having the ferroelectric property or the anti-ferroelectric property according to the electric field. The hafnium oxide layer having the tetragonal crystal phase or the orthorhombic crystal phase may have a high dielectric constant of 70 or more.

In an implementation, the dielectric constant of the dielectric layer structure 140 may be increased by using the hafnium oxide layer having the ferroelectric property. Thus, the capacitance of the capacitor may be increased by the hafnium oxide layer having the ferroelectric property. Therefore, the hafnium oxide layer 122 included in the dielectric layer structure 140 may have the tetragonal crystal phase or the orthorhombic crystal phase.

A hafnium oxide layer having a monoclinic crystal phase or an amorphous hafnium oxide layer may have no ferroelectric property. In an implementation, the hafnium oxide layer 122 included in the dielectric layer structure 140 may not have the monoclinic crystal phase and may not be amorphous. A stacked structure of the dielectric layer structure 140 may be optimized so that the hafnium oxide layer 122 may have a stable tetragonal crystal phase or a stable orthorhombic crystal phase.

A coercive field of the hafnium oxide layer 122 having the tetragonal crystal phase or the orthorhombic crystal phase may be within the operating voltage range of about −1 V to about 1 V. When the hafnium oxide layer 122 having the tetragonal crystal phase or the orthorhombic crystal phase is used as the main dielectric layer of the dielectric layer structure 140, the capacitor 180 may have a high capacitance within the operating voltage range.

Hereinafter, the hafnium oxide layer 122 may mean a hafnium oxide layer having the tetragonal crystal phase or the orthorhombic crystal phase.

The hafnium oxide layer 122 may have a thickness of about 5 Å to about 18 Å. Maintaining the thickness of the hafnium oxide layer at about 5 Å or greater may help prevent leakage currents from occurring in the capacitor. Also, it may be easier to form the hafnium oxide layer having a thickness of about 5 Å or greater. Maintaining the thickness of the hafnium oxide layer at about 18 Å or less may help ensure that a phase of the hafnium oxide layer is a tetragonal crystal phase or an orthorhombic crystal phase, rather than a monoclinic crystal phase.

The first and second zirconium oxide layers 120 and 124 may have a small lattice mismatch with the hafnium oxide layer 122. In an implementation, the first and second zirconium oxide layers 120 and 124 may directly contact upper and lower (e.g., inner and outer) surfaces of the hafnium oxide layer 122, respectively. Thus, a stacked structure including the first zirconium oxide layer 120/the hafnium oxide layer 122/the second zirconium oxide layer may have a low residual stress.

If the hafnium oxide layer 122 were to directly contact the lower electrode 110 and the upper electrode 150, a lattice mismatch between the hafnium oxide layer 122 and the lower electrode 110 and a lattice mismatch between the hafnium oxide layer 122 and the upper electrode 150 may be high. Thus, a residual stress of the hafnium oxide layer 122 could be very high. In an implementation, the hafnium oxide layer may not directly contact the lower electrode 110 and the upper electrode 150.

If the residual stress of the dielectric layer structure were to be high after the dielectric layers included in the dielectric layer structure are crystallized, an electric field for changing a direction of polarization of the dielectric layers (e.g., hafnium oxide layer 122) may be increased. Accordingly, the coercive field of the dielectric layers may be increased, and thus the electric field required for have the same polarization (P) in the dielectric layers having high residual stress may be increased.

$P = \chi_e * \varepsilon 0 * E$, $\chi_e = \varepsilon r - 1$ ($\varepsilon 0$: vacuum dielectric constant, $\varepsilon r$: dielectric constant)

$C = \varepsilon 0 * \varepsilon r * A / t$ ($A$: capacitor area, $t$: dielectric material thickness)

The electric field for having the same polarization may be increased, $\chi_e$ may be decreased, and the dielectric constant may be decreased.

If the residual stress of the dielectric layer structure were to be high, the dielectric constant of the dielectric layer structure may not be boosted at the low operating voltage range, e.g., about −1 V to about 1 V. Also, the dielectric constant of the dielectric layer structure 140 could be boosted at an operating voltage lower than −1 V and an operating voltage higher than 1 V. Thus, in order to have a high capacitance at the low operating voltage range of about −1 V to about 1 V, the residual stress of the dielectric layer structure 140 may be low.

The first and second zirconium oxide layers 120 and 124 may be crystalline. In an implementation, the first and second zirconium oxide layers 120 and 124 may have a stable tetragonal crystal phase. In an implementation, the first and second zirconium oxide layers 120 and 124 directly contacting the hafnium oxide layer 122 may be crystalline. In an implementation, the first and second zirconium oxide layers 120 and 124 may induce crystallization of the hafnium oxide layer 122 so that the hafnium oxide layer 122 may have a stable tetragonal crystal phase or an orthorhombic crystal phase during the process for forming the dielectric layer structure 140 and subsequent anneal process.

In an implementation, the first and second zirconium oxide layers 120 and 124 may have the same thickness. In an implementation, the first and second zirconium oxide layers 120 and 124 may have different thicknesses.

Each of the first and second zirconium oxide layers 120 and 124 may independently have a thickness of about 5 Å to about 30 Å. Maintaining the thickness of each of the first and second zirconium oxide layers 120 and 124 at about 5 Å or greater may help ensure that the first and second zirconium oxide layers 120 and 124 induce crystallization of the hafnium oxide layer 122 so that the hafnium oxide layer 122 may have a stable tetragonal crystal phase or an orthorhombic crystal phase. Maintaining the thickness of each of the first and second zirconium oxide layers 120 and 124 at about 30 Å or less may help ensure that the capacitor has a high target capacitance.

Figure 5:
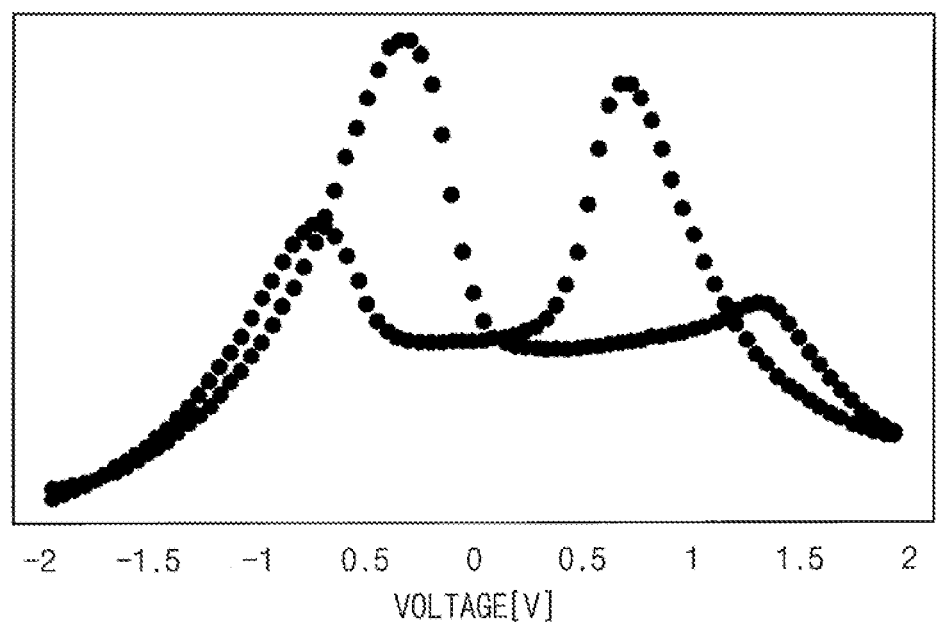
FIG. 5 is a graph showing capacitance according to applied voltage of the capacitor.

FIG. 5 is a graph showing capacitance according to applied voltage of the capacitor.

As shown in FIG. 5, a capacitance of the capacitor 180 in which the lower electrode 110, the dielectric layer structure 140, and the upper electrode 150 are stacked may have a hysteresis characteristic. The capacitance may be maximized within a voltage range of about −1 V to about 1 V.

In an implementation, the dielectric layer structure may include the first stacked structure in which the first zirconium oxide layer 120/the hafnium oxide layer 122/the second zirconium oxide layer 124 are sequentially stacked, and the dielectric layer structure may further include at least one additional layer on or under the first stacked structure.

Each of the embodiments described below is the same as the capacitor described with reference to FIGS. 1 to 4, except for the dielectric layer structure. Thus, only the dielectric layer structure is mainly described.

Figure 6:
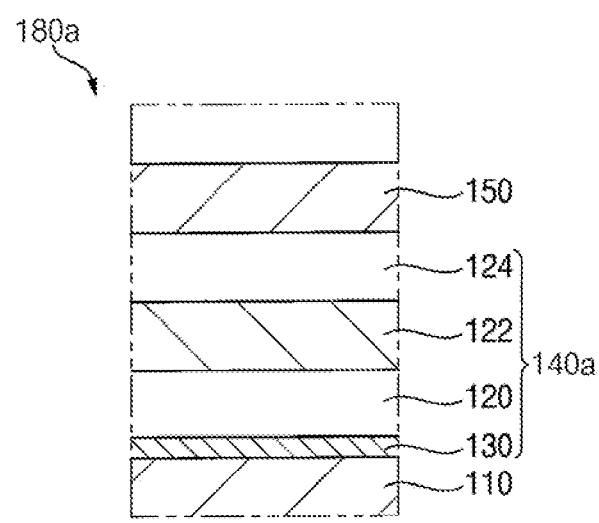
FIG. 6 is an enlarged cross-sectional view of a capacitor in accordance with example embodiments.

FIG. 6 is an enlarged cross-sectional view of a capacitor in accordance with example embodiments.

Referring to FIG. 6, the capacitor 180a may include a stack of the lower electrode 110/a dielectric layer structure 140a/the upper electrode 150.

The dielectric layer structure 140a may include an interface layer 130 and the first stacked structure in which the first zirconium oxide layer 120/the hafnium oxide layer 122/the second zirconium oxide layer 124 are stacked. In an implementation, the interface layer 130 may be additionally formed between the lower electrode 110 and the first zirconium oxide layer 120.

As described above, the dielectric layer structure 140a may have a thickness of about 20 Å to about 60 Å.

The hafnium oxide layer 122 may have a thickness of about 5 Å to about 18 Å. Each of the first and second zirconium oxide layers 120 and 124 may independently have the thickness of about 5 Å to about 30 Å. A thickness of the interface layer 130 may be controlled so that a sum of the thicknesses of the interface layer 130 and the first stacked structure in which the first zirconium oxide layer 120/the hafnium oxide layer 122/the second zirconium oxide layer 124 are stacked may be equal to or less than 60 Å. In an implementation, the interface layer 130 may have a thickness less than the thickness of the first zirconium oxide layer 120.

The interface layer 130 may help prevent direct contact between the lower electrode 110 and the first zirconium oxide layer 120. The interface layer 130 may be a layer having a small lattice mismatch with the first zirconium oxide layer 120.

In an implementation, the interface layer 130 may include a ZrNbOx layer or a TiNbOx layer. In an implementation, the interface layer 130 may have a structure in which the TiNbOx layer and the ZrNbOx layer are stacked.

In an implementation, the dielectric layer structure 140a may further include the interface layer 130, and a residual stress of the dielectric layer structure 140a may be decreased. Therefore, the capacitor including the dielectric layer structure 140a may have a high capacitance.

Figure 7:
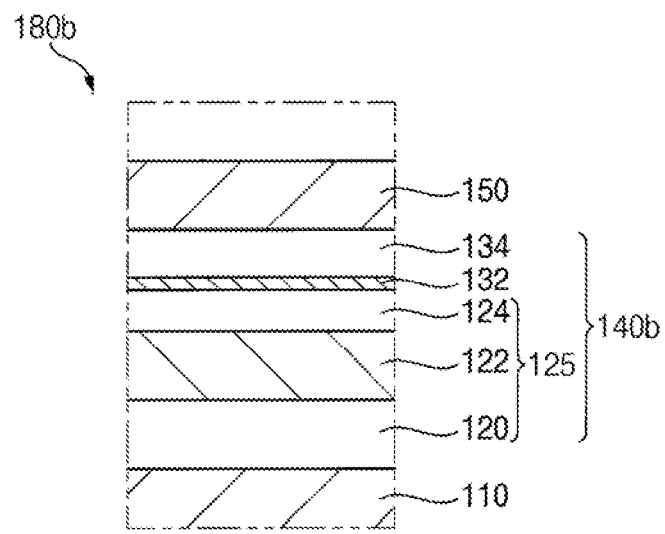
FIG. 7 is an enlarged cross-sectional view of a capacitor in accordance with example embodiments.

FIG. 7 is an enlarged cross-sectional view of a capacitor in accordance with example embodiments.

Referring to FIG. 7, the capacitor 180b may include a stack of the lower electrode 110/a dielectric layer structure 140b/the upper electrode 150.

The dielectric layer structure 140b may include the first stacked structure 125, an insert layer 132, and a third zirconium oxide layer 134. In an implementation, the insert layer 132 and the third zirconium oxide layer 134 may be further formed on the second zirconium oxide layer 124.

The dielectric layer structure 140b may have a thickness of about 20 Å to about 60 Å. The hafnium oxide layer 122 may have the thickness of about 5 Å to about 18 Å. Each of the first and second zirconium oxide layers 120 and 124 may independently have the thickness of about 5 Å to about 30 Å. Thicknesses of the insert layer 132 and the third zirconium oxide layer 134 may be controlled, respectively, so that a sum of the thicknesses of the first stacked structure in which the first zirconium oxide layer 120/the hafnium oxide layer 122/the second zirconium oxide layer 124 are stacked, the insert layer 132 and the third zirconium oxide layer 134 may be equal to or less than 60 Å.

The insert layer 132 may be between the second and third zirconium oxide layers 124 and 134. In an implementation, the second zirconium oxide layer 124 may be a crystallized layer, and the third zirconium oxide layer 134 may be an amorphous layer. The insert layer 132 may be an amorphous layer. In an implementation, the insert layer 132 may be amorphous, and the third zirconium oxide layer 134 may be formed on the insert layer 132 to be amorphous.

The insert layer 132 may include a metal oxide. In an implementation, the insert layer 132 may include an oxide of Al, Ta, Nb, Mo, W, Ru, V, Y, Sc, or Gd. In an implementation, the insert layer 132 may have a thickness less than a thickness of each of the second and third zirconium oxide layers 124 and 134.

An amorphous zirconium oxide layer may have a superior surface roughness compared to a crystalline zirconium oxide layer. Thus, in the capacitor 180b having the dielectric layer structure 140b according to the present embodiment, a concentration of an electric field due to a poor surface roughness of a dielectric layer may be decreased. Thus, leakage currents of the capacitor 180b may be decreased.

Figure 8:
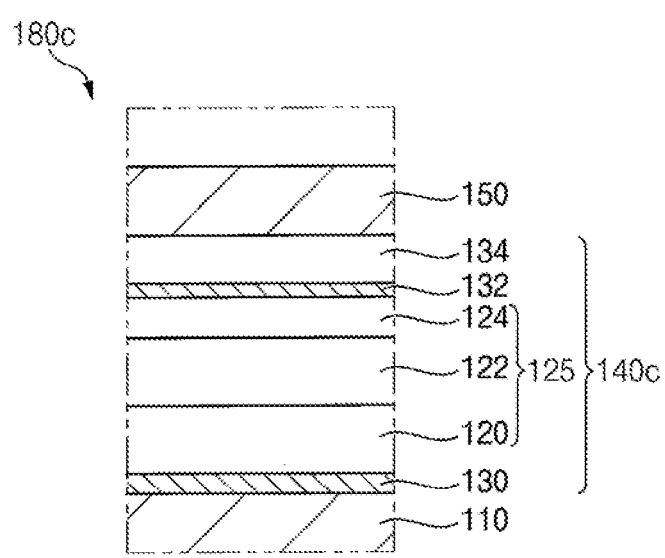
FIG. 8 is an enlarged cross-sectional view of a capacitor in accordance with example embodiments.

FIG. 8 is an enlarged cross-sectional view of a capacitor in accordance with example embodiments.

Referring to FIG. 8, the capacitor 180c may include a stack of the lower electrode 110/a dielectric layer structure 140c/the upper electrode 150.

The dielectric layer structure 140c may include the interface layer 130, the first stacked structure 125, the insert layer 132, and the third zirconium oxide layer 134. In an implementation, the interface layer 130 may be between the lower electrode 110 and the first zirconium oxide layer 120. The insert layer 132 and the third zirconium oxide layer 134 may be further formed on the second zirconium oxide layer 124.

The dielectric layer structure 140c may have a thickness of about 20 Å to about 60 Å. The hafnium oxide layer 122 may have the thickness of about 5 Å to about 18 Å. Each of the first and second zirconium oxide layers 120 and 124 may independently have the thickness of about 5 Å to about 30 Å. Thicknesses of the interface layer 130, the insert layer 132 and the third zirconium oxide layer 134 may be controlled, respectively, so that a sum of the thicknesses of the interface layer 130, the first stacked structure in which the first zirconium oxide layer 120/the hafnium oxide layer 122/the second zirconium oxide layer 124 are stacked, the insert layer 132 and the third zirconium oxide layer 134 may be equal to or less than 60 Å.

A material of the interface layer 130 may be the same as the material of the interface layer illustrated with reference to FIG. 6. A material of the insert layer 132 may be the same as the material of the insert layer illustrated with reference to FIG. 7.

The dielectric layer structure 140c may have a low residual stress. In an implementation, the capacitor having the dielectric layer structure 140c may have a high capacitance, and leakage currents of the capacitor may be decreased.

Figure 9:
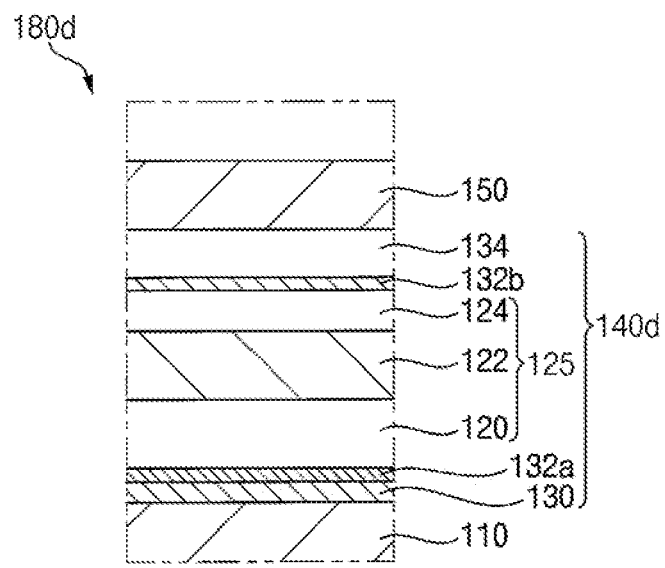
FIG. 9 is an enlarged cross-sectional view of a capacitor in accordance with example embodiments.

FIG. 9 is an enlarged cross-sectional view of a capacitor in accordance with example embodiments.

Referring to FIG. 9, the capacitor 180d may include a stack of the lower electrode 110/a dielectric layer structure 140d/the upper electrode 150.

The dielectric layer structure 140d may include the interface layer 130, a first insert layer 132a, the first stacked structure 125, a second insert layer 132b, and the third zirconium oxide layer 134. In an implementation, the capacitor may further include the first insert layer 132a between the interface layer 130 and the first stacked structure 125 in the structure of the capacitor shown in FIG. 8. A material of the first insert layer 132a may be the same as the material of the insert layer illustrated with reference to FIG. 7. The first insert layer 132a may prevent materials in the first stacked structure 125 from diffusing toward the lower electrode 110.

In an implementation, the second insert layer may not be formed.

Figure 10:
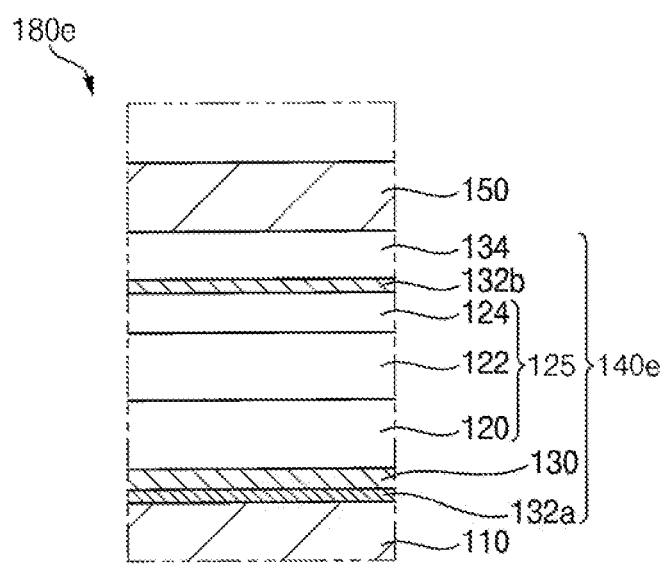
FIG. 10 is an enlarged cross-sectional view of a capacitor in accordance with example embodiments.

FIG. 10 is an enlarged cross-sectional view of a capacitor in accordance with example embodiments.

Referring to FIG. 10, the capacitor 180e may include a stack of the lower electrode 110/a dielectric layer structure 140e/the upper electrode 150.

The dielectric layer structure 140e may include the first insert layer 132a, the interface layer 130, the first stacked structure 125, the second insert layer 132b, and the third zirconium oxide layer 134. In an implementation, the capacitor may further include the first insert layer 132a between the lower electrode 110 and the interface layer 130 in the structure of the capacitor shown in FIG. 8. A material of the first insert layer 132a may be the same as the material of the insert layer illustrated with reference to FIG. 7.

In an implementation, the second insert layer may not be formed.

In an implementation, the dielectric layer structure may further include an insert layer between the interface layer 130 and the first stacked structure 125 in the dielectric layer structure shown in FIG. 10. In an implementation, a stacked structure including an insert layer/an interface layer/an insert layer may be between the lower electrode 110 and the first stacked structure 125.

Figure 11:
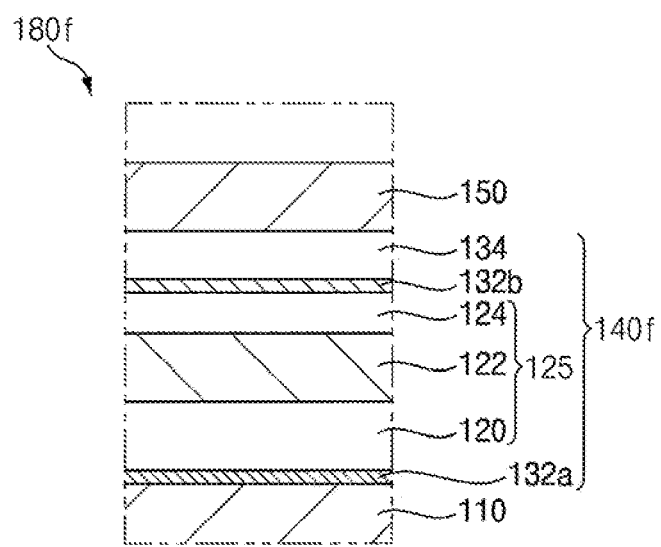
FIG. 11 is an enlarged cross-sectional view of a capacitor in accordance with example embodiments.

FIG. 11 is an enlarged cross-sectional view of a capacitor in accordance with example embodiments.

Referring to FIG. 11, the capacitor 180f may include a stack of the lower electrode 110/a dielectric layer structure 140f/the upper electrode 150.

The dielectric layer structure 140f may include the first insert layer 132a, the first stacked structure 125, the second insert layer 132b, and the third zirconium oxide layer 134. In an implementation, the dielectric layer structure 140f may not include an interface layer, and may further include the first insert layer 132a between the lower electrode 110 and the first stacked structure 125 in the dielectric layer structure shown in FIG. 10. A material of the first insert layer 132a may be the same as the material of the insert layer illustrated with reference to FIG. 7. In an implementation, the second insert layer may not be formed.

Figure 12:
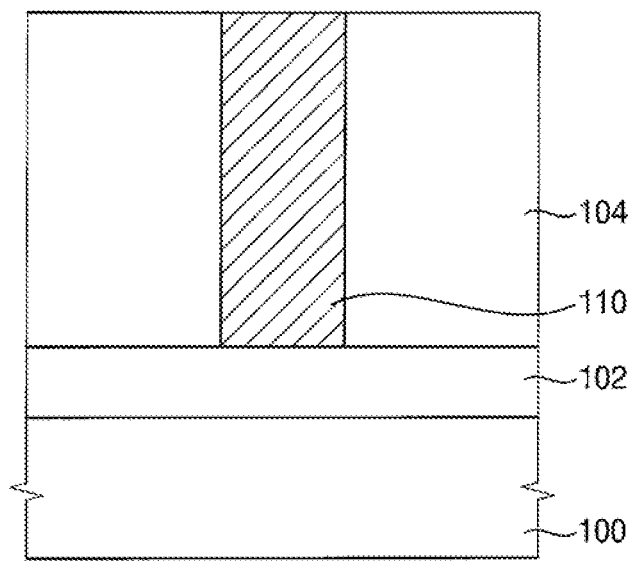
FIGS. 12 to 14 are cross-sectional views of stages in a method of manufacturing a capacitor in accordance with example embodiments.
Figure 13:
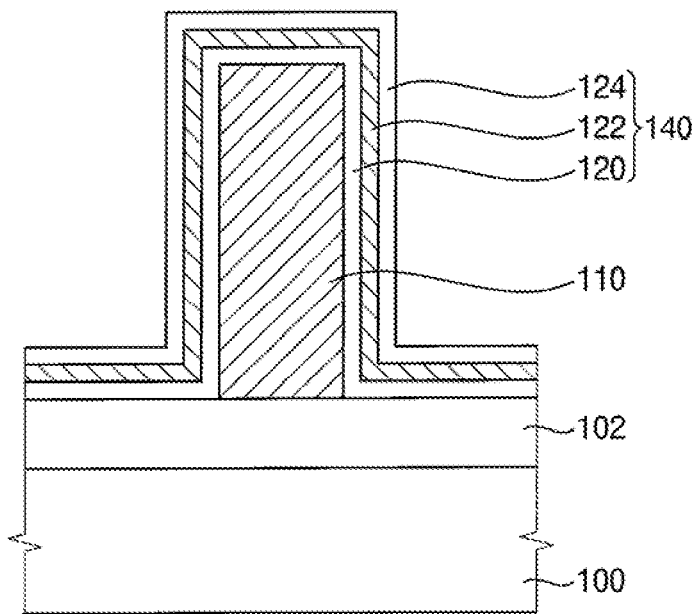
Figure 14:
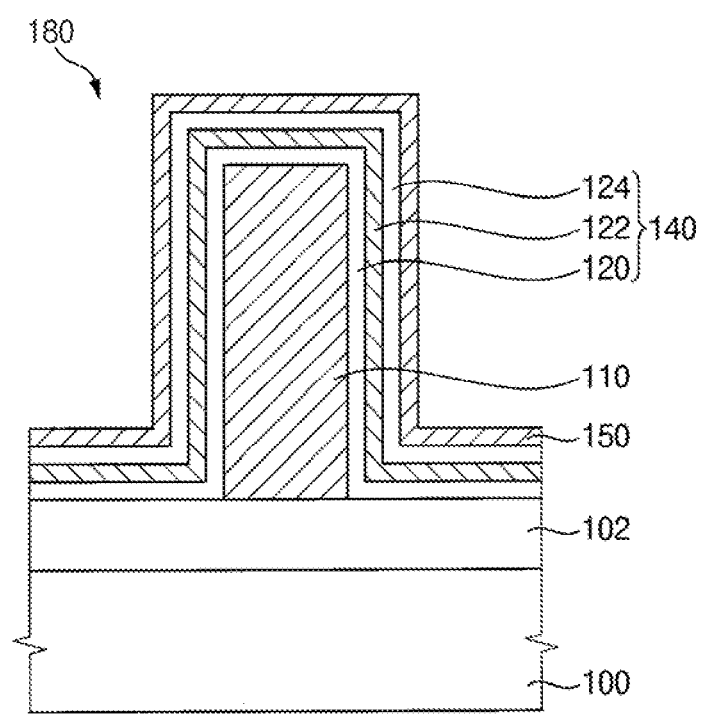

FIGS. 12 to 14 are cross-sectional views of stages in a method of manufacturing a capacitor in accordance with example embodiments.

Hereinafter, an example of a method of manufacturing a capacitor including a lower electrode having a pillar shape is described.

Referring to FIG. 12, a mold layer 104 may be formed on a substrate. A portion of the mold layer 104 may be etched to form a hole. The hole may be formed at a portion for forming a lower electrode.

In an implementation, before forming the mold layer 104, a lower structure 102 may be further formed on the substrate 100. The lower structure 102 may include lower circuits including a transistor, a contact plug, and a conductive line and an insulating interlayer covering the lower circuits.

A lower electrode layer may be formed on the mold layer 104 to fill the hole. The lower electrode layer may be planarized until an upper surface of the mold layer 104 may be exposed to form a lower electrode 110 in the hole.

In an implementation, the lower electrode layer may be deposited by a deposition process such as a physical vapor deposition (PVD) process, a chemical vapor deposition (CVD) process, or an atomic layer deposition (ALD) process. The planarization process may include a chemical mechanical polishing (CMP) process or an etch back process.

In an implementation, the lower electrode layer may be formed on the lower structure 102. The lower electrode layer may be patterned by a photolithography process to form the lower electrode 110. In this case, the mold layer may not be formed on the lower structure 102.

Referring to FIG. 13, the mold layer 104 may be removed. Thus, a surface of the lower electrode 110 having a pillar shape may be exposed.

A first zirconium oxide layer 120 may be conformally formed on surfaces of the lower electrode 110 and the lower structure 102 to have a uniform thickness. A hafnium oxide layer 122 may be formed on the first zirconium oxide layer 120. A second zirconium oxide layer 124 may be formed on the hafnium oxide layer 122. Thus, a first stacked structure in which the first zirconium oxide layer 120/the hafnium oxide layer 122/the second zirconium oxide layer 124 are stacked may be formed on the lower electrode 110 and the lower structure 102.

The hafnium oxide layer 122 may be formed to have a tetragonal crystal phase or an orthorhombic crystal phase. Each of the first and second zirconium oxide layers 120 and 124 may be formed to have a crystalline phase. In an implementation, each of the first and second zirconium oxide layers 120 and 124 may have a tetragonal crystal phase, which is a stable phase.

The dielectric layer structure 140 may have a thickness of about 20 Å to about 60 Å. Each of the first and second zirconium oxide layers 120 and 124 may independently have a thickness of about 5 Å to about 30 Å. The hafnium oxide layer 122 may have a thickness of about 5 Å to about 18 Å.

In an implementation, each of the first zirconium oxide layer 120, the hafnium oxide layer 122, and the second zirconium oxide layer 124 may be formed by an atomic layer deposition (ALD) process. The deposition process of each of the first zirconium oxide layer 120, the hafnium oxide layer 122, and the second zirconium oxide layer 124 may be performed at a relatively low temperature, e.g., of about 200° C. to about 450° C. Performing the deposition process of each of the first zirconium oxide layer 120, hafnium oxide layer 122, and second zirconium oxide layer 124 at about 200° C. or greater may help ensure that each of precursors may be thermally decomposed, and the layers may be suitably deposited. Performing the deposition process of each of the first zirconium oxide layer 120, the hafnium oxide layer 122, and the second zirconium oxide layer 124 at about 450° C. or less may help ensure that the layers grow stably. In an implementation, the deposition process of each of the first zirconium oxide layer 120, the hafnium oxide layer 122, and the second zirconium oxide layer 124 may be performed at a temperature of about 200° C. to about 320° C.

In an implementation, in the deposition process of each of the first zirconium oxide layer 120, the hafnium oxide layer 122, and the second zirconium oxide layer 124, an oxidant may include $O_3$, $H_2O$, or $O_2$.

In an implementation, each of the first zirconium oxide layer 120, the hafnium oxide layer 122, and the second zirconium oxide layer 124 may be formed in a deposition apparatus of a batch-type. In an implementation, each of the first zirconium oxide layer 120, the hafnium oxide layer 122, and the second zirconium oxide layer 124 may be formed in a deposition apparatus of single wafer type.

In an implementation, a deposition chamber for forming the first and second zirconium oxide layers 120 and 124 and a deposition chamber for forming the hafnium oxide layer 122 may be different from each other. In an implementation, a deposition chamber for forming the first and second zirconium oxide layers 120 and 124 and a deposition chamber for forming the hafnium oxide layer 122 may be the same.

In an implementation, the hafnium oxide layer 122 may be formed between the first and second zirconium oxide layers 120 and 124, and the first stacked structure including the first zirconium oxide layer 120/the hafnium oxide layer 122/the second zirconium oxide layer stacked may have a low residual stress.

The hafnium oxide layer 122 may be crystallized at a low temperature, during forming the hafnium oxide layer 122 and the second zirconium oxide layer 124 on the hafnium oxide layer 122. Thus, the hafnium oxide layer 122 may have a tetragonal crystal phase or an orthorhombic crystal phase. In addition, the first and second zirconium oxide layers 120 and 124 may be also crystallized during forming the first and second zirconium oxide layers 120 and 124 and the hafnium oxide layer 122. Thus, the first and second zirconium oxide layers 120 and 124 may have a stable tetragonal crystal phase.

In an implementation, before forming the first zirconium oxide layer 120, an interface layer (refer to FIG. 6, 130) may be further formed on surfaces of the lower electrode 110 and the lower structure 102 to have a uniform thickness. In an implementation, the interface layer 130 may be formed by an atomic layer deposition process. The deposition process of the interface layer 130 may be performed at a low temperature of about 200° C. to about 450° C. In an implementation, the deposition process of the interface layer 130 may be performed at a temperature of about 200° C. to about 320° C. In this case, the capacitor as shown in FIG. 6 may be formed by subsequent processes.

In an implementation, an insert layer (refer to FIG. 7, 132) and a third zirconium oxide layer (refer to FIG. 7, 134) may be further formed on the second zirconium oxide layer 124. The insert layer 132 may include a metal oxide. In an implementation, the insert layer 132 may include an oxide of Al, Ta, Nb, Mo, W, Ru, V, Y, Sc, or Gd. In an implementation, the insert layer 132 may be formed to have a thickness less than a thickness of each of the second and third zirconium oxide layers 124 and 134. In an implementation, the insert layer 132 and the third zirconium oxide layer 134 may be formed by an atomic layer deposition process. The deposition processes of the insert layer 132 and the third zirconium oxide layer 134 may be performed at a low temperature of about 200° C. to about 450° C. In an implementation, the deposition processes of the insert layer 132 and the third zirconium oxide layer 134 may be performed at a temperature of about 200° C. to about 320° C. In this case, the capacitor as shown in FIG. 7 may be formed by subsequent processes.

In an implementation, before forming the first zirconium oxide layer 120, an interface layer (refer to FIG. 8, 130) may be further formed on surfaces of the lower electrode 110 and the lower structure 102 to have a uniform thickness. An insert layer (refer to FIG. 8, 132) and a third zirconium oxide layer (refer to FIG. 8, 134) may be further formed on the second zirconium oxide layer 124. In this case, the capacitor as shown in FIG. 8 may be formed by subsequent processes.

One of the capacitors shown in FIGS. 9 to 11 may be formed by additionally performing the processes of forming an interface layer and/or insert layers and subsequent processes.

Referring to FIG. 14, an upper electrode 150 may be formed on the second zirconium oxide layer 124.

In an implementation, the upper electrode 150 may be formed of a material the same as a material of the lower electrode 110. In an implementation, the upper electrode 150 may be formed of a material different from a material of the lower electrode 110.

In an implementation, the upper electrode 150 may be formed by a deposition process such as a physical vapor deposition (PVD) process, a chemical vapor deposition (CVD) process, and atomic layer deposition (ALD) process.

In an implementation, after forming the upper electrode 150, an anneal process may be further performed. When the anneal process is performed, the first zirconium oxide layer 120/the hafnium oxide layer 122/the second zirconium oxide layer 124 included in the dielectric layer structure 140 may be additionally or further crystallized. In an implementation, the anneal process may be performed at a temperature higher than temperatures of deposition processes for forming the dielectric layer structure 140.

As described above, the hafnium oxide layer 122 included in the dielectric layer structure 140 may have the tetragonal crystal phase or the orthorhombic crystal phase. The zirconium oxide layers 120 and 124 may be formed on the upper and lower (e.g., inner and outer) surfaces of the hafnium oxide layer 122, respectively, so that residual stress of the dielectric layer structure 140 may be decreased. Thus, the dielectric layer structure 140 may have a low coercive field, and a capacitance of the capacitor may be highly increased within a range of about −1V to about 1V, which is an operating voltage range of the capacitor including the dielectric layer structure 140.

Figure 15:
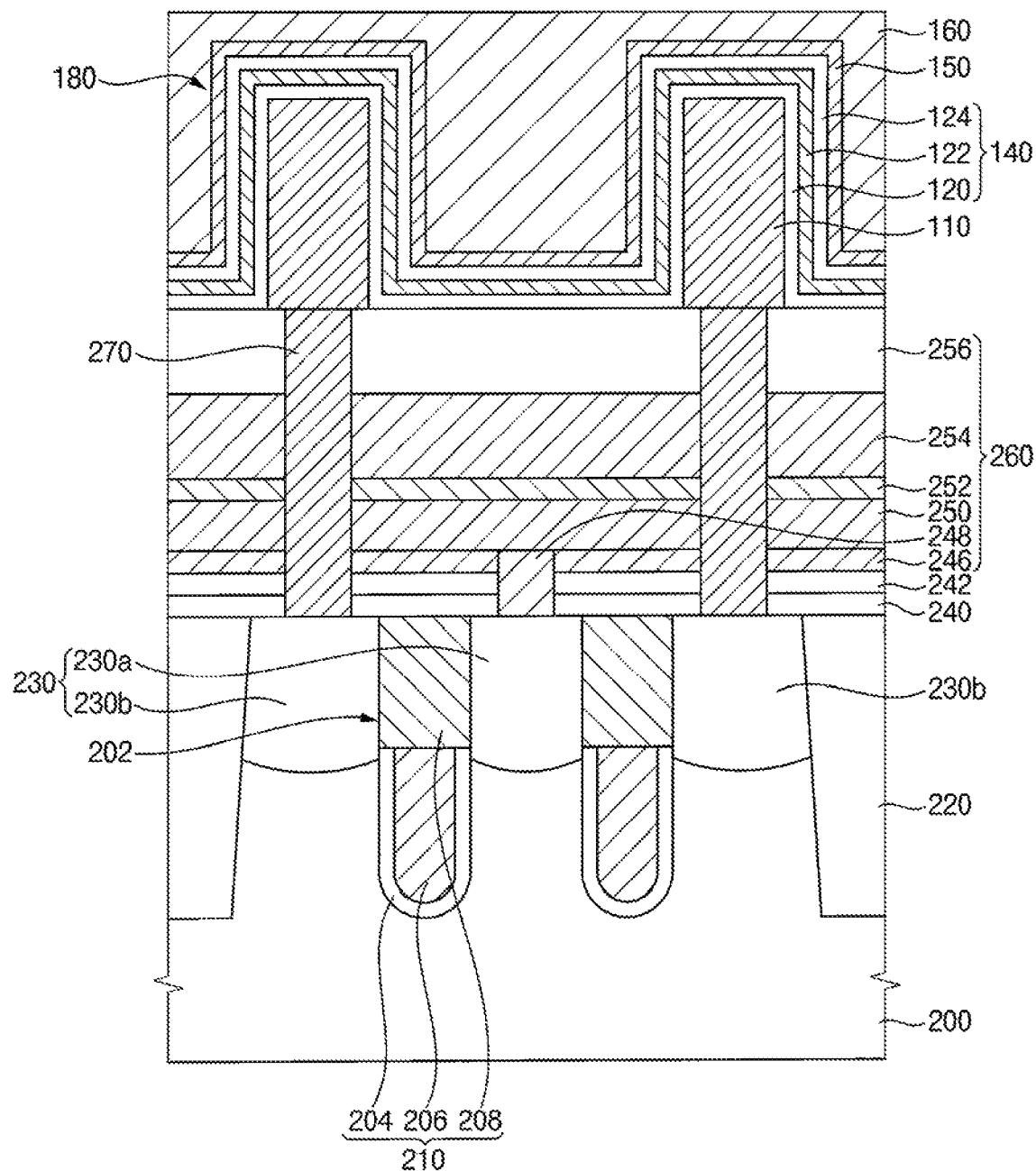
FIG. 15 is a cross-sectional view of a DRAM device having a capacitor in accordance with example embodiments.

FIG. 15 is a cross-sectional view of a DRAM device having a capacitor in accordance with example embodiments.

Although the DRAM device is only shown in FIG. 15, the capacitor may be used in all memory devices using the capacitor as a data storage unit.

Referring to FIG. 15, the DRAM device may include a cell transistor, a capacitor, and a bit line formed on a substrate. The DRAM device may include a unit cell including one cell transistor and one capacitor.

The substrate 200 may include an active region and a field region. The field region may be a region in which an isolation layer 220 is formed in an isolation trench included in the substrate 200. The active region may be a region of the substrate other than the field region.

A gate trench 202 extending in a first direction parallel to an upper surface of the substrate 200 may be formed at an upper portion of the substrate 200. A gate structure 210 may be formed in the gate trench 202.

In an implementation, the gate structure 210 may include a gate insulation layer 204, a gate electrode 206, and a capping insulation pattern 208. A plurality of gate structures 210 may be arranged in a second direction parallel to the upper surface of the substrate 200 and perpendicular to the first direction.

The gate insulation layer 204 may include silicon oxide. The gate electrode 206 may include a metal material or polysilicon. The capping insulation pattern 208 may include silicon nitride.

Impurity regions 230 serving as source/drain regions may be formed at the active region of the substrate 100 between the gate structures 210.

In an implementation, the impurity regions 230 may include a first impurity region 230a electrically connected to a bit line structure 260 and a second impurity region 230b electrically connected to a capacitor 180.

A pad insulation pattern 240, a first etch stop pattern 242, and a first conductive pattern 246 may be formed on the active region, the isolation layer 220, and the gate structure 210. The pad insulation pattern 240 may include an oxide such as silicon oxide, and the first etch stop pattern 242 may include a nitride such as silicon nitride. The first conductive pattern 246 may include polysilicon doped with impurities.

A recess portion may pass through a stacked structure including the pad insulation pattern 240, the first etch stop pattern 242, and the first conductive pattern 246. The recess portion may be disposed at a portion of the substrate 100 between the gate structures. An upper surface of the first impurity region 230a may be exposed by a bottom of the recess portion.

A second conductive pattern 248 may be formed to fill the recess portion. The second conductive pattern 248 may include, e.g., polysilicon doped with impurities. In an implementation, the second conductive pattern 248 may contact the first impurity region 230a.

A third conductive pattern 250 may be stacked on the first conductive pattern 246 and the second conductive pattern 248. The third conductive pattern 250 may include, e.g., polysilicon doped with impurities. As the first to third conductive patterns 246, 248, and 250 include substantially the same material, the first to third conductive patterns 246, 248, and 250 may be merged into one pattern. A barrier metal pattern 252, a metal pattern 254, and a hard mask pattern 256 may be stacked on the third conductive pattern 250.

A stacked structure including the first conductive pattern 246, the second conductive pattern 248, the third conductive pattern 250, the barrier metal pattern 252, the metal pattern 254, and the hard mask pattern 256 may serve as a bit line structure 260.

In an implementation, the second conductive pattern 248 may serve a bit line contact, and the first conductive pattern 246, the third conductive pattern 250, the barrier metal pattern 252 and the metal pattern 254 may serve as a bit line. The bit line structure 260 may extend in the second direction. A plurality of bit line structures 260 may be arranged in the first direction.

In an implementation, a spacer may be formed on sidewalls of the bit line structure 260.

In an implementation, a first insulating interlayer may be formed to fill a portion between the bit line structures 260.

A contact plug 270 may be formed through the first insulating interlayer, the first etch stop pattern 242 and the pad insulation pattern 240. The contact plug 270 may contact the second impurity region 230b. The contact plug 270 may be between the bit line structures 260.

A capacitor 180 may be formed on the contact plug 270.

The capacitor 180 may include a lower electrode 110, a dielectric layer structure 140, and an upper electrode 150. The dielectric layer structure 140 may include a stack of the first zirconium oxide layer 120/the hafnium oxide layer 122/the second zirconium oxide layer 124.

The capacitor 180 may have a structure the same as a structure of the capacitor as illustrated with reference to FIG. 1. In an implementation, the capacitor may have a structure the same as a structure of one of the capacitors illustrated with reference to FIGS. 6 to 8.

A plate electrode 160 may be further formed on the upper electrode 150. The plate electrode 160 may include polysilicon doped with impurities.

The DRAM device may be operated in the operating voltage range of about −1V to about 1V. In the capacitor, a dielectric constant of the dielectric layer structure may be highly boosted in the operating voltage range of about −1 V to about 1 V, and thus a capacitance of the capacitor may be greatly increased. The DRAM device may have excellent electrical characteristics.

By way of summation and review, as a DRAM device is highly integrated, it may be difficult for the capacitor included in the DRAM to have high capacitance and low leakage currents.

One or more embodiments may provide a capacitor having a high capacitance.

One or more embodiments may provide a DRAM device including a capacitor having a high capacitance.

In example embodiments, the dielectric layer structure included in the capacitor may have a ferroelectric property within an operating voltage range, e.g., the operating voltage range of about −1 V to about 1 V. The capacitor may have a high capacitance within the operating voltage range.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor, comprising:
a lower electrode;
a dielectric layer structure on the lower electrode, the dielectric layer structure including a first zirconium oxide layer, a hafnium oxide layer, and a second zirconium oxide layer sequentially stacked; and
an upper electrode on the dielectric layer structure,
wherein the first zirconium oxide layer is between the hafnium oxide layer and the lower electrode and the second zirconium oxide layer is between the hafnium oxide layer and the upper electrode,
wherein the hafnium oxide layer is sandwiched directly between the first zirconium oxide layer and the second zirconium oxide layer,
wherein the dielectric layer structure further includes an interface layer, the interface layer being between the first zirconium oxide layer and the lower electrode and directly contacting the lower electrode, and
wherein the interface layer includes a ZrNbOx layer, a TiNbOx layer, or a stacked structure of the TiNbOx layer and the ZrNbOx layer, the material of the interface layer being different from that of the first zirconium oxide layer and the second zirconium oxide layer.

2. The capacitor as claimed in claim 1, wherein the first zirconium oxide layer and the second zirconium oxide layer are each crystalline.

3. The capacitor as claimed in claim 2, wherein the first zirconium oxide layer and the second zirconium oxide layer have a tetragonal crystal phase.

4. The capacitor as claimed in claim 1, wherein the hafnium oxide layer has a thickness of about 5 Å to about 18 Å.

5. The capacitor as claimed in claim 1, wherein each of the first zirconium oxide layer and the second zirconium oxide layer independently has a thickness of about 5 Å to about 30 Å.

6. The capacitor as claimed in claim 1, wherein the dielectric layer structure has a thickness of about 20 Å to about 60 Å.

7. The capacitor as claimed in claim 1, wherein the dielectric layer structure further includes an insert layer and a third zirconium oxide layer, the insert layer including an oxide of Al, Ta, Nb, Mo, W, Ru, V, Y, Sc, or Gd.

8. The capacitor as claimed in claim 7, wherein the insert layer and the third zirconium oxide layer are amorphous.

9. The capacitor as claimed in claim 1, wherein the lower electrode includes a metal, a metal nitride, or a conductive oxide.

10. A capacitor, comprising:
a lower electrode;
a dielectric layer structure on the lower electrode, the dielectric layer structure including a first zirconium oxide layer, a hafnium oxide layer, and a second zirconium oxide layer sequentially stacked; and
an upper electrode on the dielectric layer structure,
wherein:
the dielectric layer structure has a thickness of about 20 Å to about 60 Å,
the hafnium oxide layer has a thickness of about 5 Å to about 18 Å,
each of the first zirconium oxide layer and the second zirconium oxide layer independently has a thickness of about 5 Å to about 30 Å,
the dielectric layer structure further includes an interface layer, the interface layer being between the first zirconium oxide layer and the lower electrode and directly contacting the lower electrode, and
the interface layer includes a ZrNbOx layer, a TiNbOx layer, or a stacked structure of the TiNbOx layer and the ZrNbOx layer, the material of the interface layer being different from that of the first zirconium oxide layer and the second zirconium oxide layer.

11. The capacitor as claimed in claim 10, wherein the hafnium oxide layer has a tetragonal crystal phase or an orthorhombic crystal phase.

12. The capacitor as claimed in claim 10, wherein the first zirconium oxide layer and the second zirconium oxide layer each have a tetragonal crystal phase.

13. The capacitor as claimed in claim 10, wherein:
the dielectric layer structure further includes an insert layer and a third zirconium oxide layer, and
the insert layer includes an oxide of Al, Ta, Nb, Mo, W, Ru, V, Y, Sc, or Gd.

14. A dynamic random-access memory (DRAM) device, comprising:
a substrate;
a cell transistor on the substrate, the cell transistor including a gate structure, a first impurity region, and a second impurity region;
a bit line structure electrically connected to the first impurity region; and
a capacitor on the bit line structure, the capacitor being electrically connected to the second impurity region,
wherein the capacitor includes:
a lower electrode;
a dielectric layer structure on the lower electrode, the dielectric layer structure including a first zirconium oxide layer, a hafnium oxide layer, and a second zirconium oxide layer sequentially stacked and further includes an interface layer, the interface layer being between the first zirconium oxide layer and the lower electrode and directly contacting the lower electrode; and
an upper electrode on the dielectric layer structure,
wherein the dielectric layer structure has a thickness of about 20 Å to about 60 Å, and
wherein the interface layer includes a ZrNbOx layer, a TiNbOx layer, or a stacked structure of the TiNbOx layer and the ZrNbOx layer, the material of the interface layer being different from that of the first zirconium oxide layer and the second zirconium oxide layer.

15. The DRAM device as claimed in claim 14, wherein the first zirconium oxide layer and the second zirconium oxide layer are each crystalline.

* * * * *